United States Patent
Huang

(10) Patent No.: US 6,489,230 B1
(45) Date of Patent: Dec. 3, 2002

(54) INTEGRATION OF LOW-K SIOF AS INTER-LAYER DIELECTRIC

(75) Inventor: Richard J. Huang, Cupertino, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/886,032

(22) Filed: Jun. 22, 2001

Related U.S. Application Data

(62) Division of application No. 09/203,572, filed on Dec. 2, 1998, now Pat. No. 6,252,303.

(51) Int. Cl.[7] ............................................. H01L 21/4763
(52) U.S. Cl. ..................... 438/624; 438/637; 438/782; 438/783; 438/784; 438/787
(58) Field of Search ................................. 438/624, 637, 438/782, 783, 784, 787

(56) References Cited

U.S. PATENT DOCUMENTS

| | | | |
|---|---|---|---|
| 5,807,785 A | 9/1998 | Ravi | 438/624 |
| 5,896,149 A | 4/1999 | Denison et al. | 427/579 |
| 6,008,120 A | 12/1999 | Lee | 438/634 |
| 6,051,321 A | 4/2000 | Ravi et al. | 118/723 E |
| 6,070,550 A * | 6/2000 | Ravi et al. | 118/723 |
| 6,103,601 A * | 8/2000 | Lee et al. | 438/513 |
| 6,136,685 A * | 10/2000 | Narwankar et al. | 438/624 |

* cited by examiner

*Primary Examiner*—John F. Niebling
*Assistant Examiner*—Lynne A. Gurley
(74) *Attorney, Agent, or Firm*—Foley & Lardner

(57) ABSTRACT

A semiconductor device formed on a substrate includes at least one metal stack formed on the substrate. A fluorosilicate glass layer is formed on the at least one metal stack, where the fluorosilicate glass layer acts as an interlayer dielectric for the semiconductor device. The fluorosilicate glass layer includes a fluorine-depleted layer at a top portion of the fluorosilicate glass layer that is further away from the substrate. The fluorine-depleted layer is formed by treating the fluorosilicate glass layer with a hydrogen plasma, such as an $H_2/N_2$ plasma. The fluorine-depleted layer lessens a likelihood of fluorine atoms in the fluorosilicate glass layer from moving into and thereby corrupting a conducting layer formed above the fluorosilicate glass layer.

22 Claims, 3 Drawing Sheets

INTEGRATION OF LOW-K SIOF AS INTER-LAYER DIELECTRIC

This application is a divisional of 09/203,572 filed Dec. 2, 1998 now U.S. Pat. No. 6,252,303.

BACKGROUND OF THE INVENTION

1. Field of the Invention

The present invention relates to the integration of low-K SiOF as an inter-layer dielectric (ILD). In particular, the present invention relates to integrating fluorosilicate glass (FSG) or SiOF as a full stack inter-metal dielectric, to thereby obtain the benefit of a low dielectric constant (low-k) to improve device performance.

2. Description of the Related Art

Fluorinated $SiO_2$, typically provided by way of plasma enhanced chemical vapor deposition (PECVD) or by way of high density plasma (HDP), can be used to lower the dielectric constant of $SiO_2$ from, for example, 4.0 to 3.5-3.8. The lowering of the dielectric constant is advantageous for a number of reasons, including the reduction of the capacitance of a semiconductor device, which results in an improved performance of the semiconductor device.

However, fluorine in $SiO_2$ will react with physical vapor deposition (PVD) or chemical vapor deposition (CVD) barrier metals, such as Ti, TiN, Ta, TaN, etc., which are subsequently deposited on the surface of the fluorinated $SiO_2$. This reaction between fluorine and the barrier metals will cause delamination on flat SiOF surfaces, as well as inside via holes. Both of these occurrences are disadvantageous.

SUMMARY OF THE INVENTION

It is an object of the present invention to provide a full stack fluorosilicate glass (FSG) as an inter-layer dielectric, whereby the possibility of fluorine leakage to neighboring layers is lessened by treating the FSG with a plasma such that a fluorine-depleted region and a nitrided region are obtained.

It is another object of the present invention to provide an oxide cap on top of nitrided region to provide an additional barrier to the fluorine atoms from moving into adjacent conductive (e.g., metal) layers.

It is yet another object of the present invention to provide a full stack FSG as an inter-metal dielectric layer using in-situ deposition.

The above-mentioned objects and other advantages of the present invention may be achieved by a method of forming an interlayer dielectric on a substrate. The method includes a step of forming a conducting layer on the substrate. The method also includes a step of forming a first interlayer dielectric layer on the conducting layer by HDP using a high etch/deposition ratio with high bias power, the first interlayer dielectric layer containing fluorine. The method further includes a step of forming a second interlayer dielectric layer on the first interlayer dielectric layer by HDP using a low etch/deposition ratio, the second interlayer dielectric layer containing fluorine. The first and second interlayer dielectric layers collectively form the interlayer dielectric between the conducting layer and any other conducting layers formed above the interlayer dielectric.

The above-mentioned objects and other advantages may also be achieved by a semiconductor device formed on a substrate. The semiconductor device includes at least one conductive layer formed on the substrate. The device also includes a fluorosilicate glass layer formed on the at least one conductive layer, the fluorosilicate glass layer acting as an interlayer dielectric for the semiconductor device. The fluorosilicate glass layer includes a fluorine-depleted layer at a top portion of the fluorosilicate glass. The fluorine-depleted layer lessens a likelihood of fluorine atoms in the fluorosilicate glass layer from moving into and thereby corrupting another conducting layer formed above the fluorosilicate glass layer.

The above-mentioned objects and advantages may still further be achieved by a semiconductor device formed on a substrate. The semiconductor device includes at least one conductive layer formed on the substrate. The device also includes a first fluorosilicate glass layer formed on the at least one conductive layer, the first fluorosilicate glass layer having a thickness greater than a height of the at least one metal stack, where the first fluorosilicate glass layer is formed by HDP with a high etch/deposition ratio. The device further includes a second fluorosilicate glass layer formed on the first fluorosilicate glass, the second fluorosilicate glass layer acting together with the first fluorosilicate glass as an interlayer dielectric for the semiconductor device and having a thickness greater than the thickness of the first fluorosilicate glass layer, where the second fluorosilicate glass layer is formed by HDP with a low etch/deposition ratio.

BRIEF DESCRIPTION OF THE DRAWINGS

The above-mentioned objects and advantages of the invention will become more fully apparent from the following detailed description when read in conjunction with the accompanying drawings, with like reference numerals indicating corresponding parts throughout, and wherein.

DETAILED DESCRIPTION OF THE PREFERRED EMBODIMENTS

The present invention will be described in detail below, with references to the accompanying figures. The present invention is described in the context of use with an inter-layer dielectric layer (ILD) in a conducting stack on a semiconductor chip. However, the present invention has broad application to other structures or devices where a dielectric layer containing fluorine is used as an interlayer dielectric for other kinds of conductive layers.

Figure 1A:
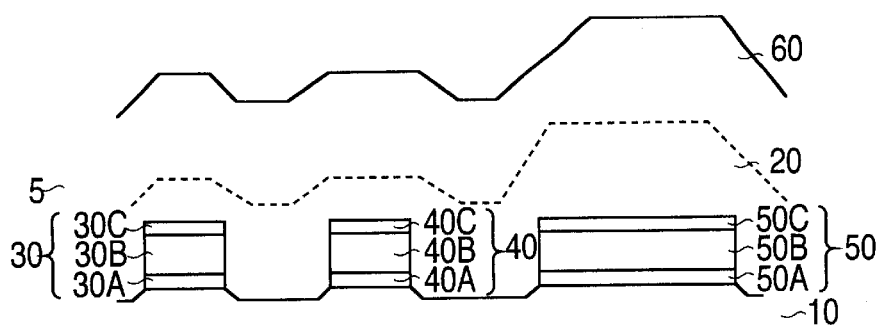
FIGS. 1A–1H show steps involved in the formation of an inter-layer dielectric layer according to a preferred embodiment of the invention.

FIGS. 1A–1H illustratively show the steps involved in creating a low-K SiOF (or fluorosilicate glass) as an inter-metal dielectric for a semiconductor device formed on a substrate (e.g., silicon substrate). FIG. 1A shows a first fluorosilicate glass (FSG) layer 20 that has been deposited onto a semiconductor substrate 10. The first FSG layer 20 covers metal stacks 30, 40, and 50. Each metal stack 30, 40, 50 may include, for example, a liner 30A, 40A, 50A that is either a Ti or TiN layer, an aluminum (or other type of conductive metal) layer 30B, 40B, 50B, and an anti-reflective coating (ARC) layer 30C, 40C, 50C. Of course, other configurations and elements may be used to construct the metal stacks 30, 40, 50 while remaining within the scope of the invention as described herein.

The first FSG layer 20 is deposited by way of an in-situ gap-fill high density plasma (HDP) process having a high etch/deposition ratio with high bias power.

The first FSG layer 20 is deposited by way of an in-situ gap-fill high density plasma (HDP) process having a high etch/deposition ratio with high bias power. HDP uses both an etch element and a deposition element to provide for an etch/deposition process in-situ. Having a high etch/deposition ratio is useful for gap filling, such as between closely-positioned metal stacks on a substrate. In the present invention, the first FSG layer 20 is preferably deposited using HDP at an etch/deposition ratio of between 0.6 to 0.8. This means that, for every 100 angstroms of FSG that is deposited, about 60–80 angstroms will be etched away due to the high bias power that causes the material being etched to "knock off" some of the material already deposited. The preferred thickness of the first FSG layer 20 is in a range of from 0.8 to 1.0 microns. Of course, other thicknesses are possible. One of ordinary skill in the art will recognize that the function of the first FSG layer 20 is usually done in two steps, one step being the formation of a thin (100 to 200 angstrom) FSG layer using a very low bias power (and thus a low etch/deposition ratio), and then a next step being the formation of the rest of the first FSG layer by using a high bias power and high etch/deposition ratio. The thin FSG layer that is initially deposited acts as a protection layer for the metal stacks 30, 40, 50 that might otherwise by partially etched (and thereby damaged) due to the high bias power used in the later step of forming the bulk of the first FSG layer 20. The thickness of the first FSG layer 20 is preferably about 1.2 times the height of the metal stacks 30, 40 and 50. Of course, other ratios of first FSG layer/metal stack thickness are possible while remaining within the scope of the invention. The first FSG layer 20 preferably has a dielectric constant in a range of from 3.5 to 3.8, with the exact value depending upon the amount of fluorine in the first FSG layer 20.

After the first FSG layer 20 has been deposited, a second FSG layer 60 is deposited on top of the first FSG layer 20, as shown in FIG. 1A. The boundary between the first FSG layer 20 and the second FSG layer 60 is shown by the dashed line in FIG. 1A. The second FSG layer 60 is deposited by way of an in-situ HDP process, similar to the one performed in depositing the first FSG layer 20, but with a lower etch/deposition ratio. The second FSG layer 60 is deposited using a lower bias power and thus lower etch/deposition ratio, since, once the gaps between the metal stacks 30, 40, 50 are filled by the first FSG layer 20, a large amount of etch element is no longer needed for gap filling. Thus, a primarily-deposition process can be performed in-situ for the forming of the second FSG layer 60, which provides a higher throughput than that obtained in the formation of the first FSG layer 20. Typical etch/deposition ratios for the second FSG layer 60 are in the range of from 0.1 to 0.5.

Alternatively, the second FSG layer may be formed by PECVD, which has even a higher throughput but requires a different chamber to be used in this alternative way of forming the second FSG layer 60. The etch chemistry to be used in this alternative way of forming the second FSG layer 60 is TEOS-based, such as a PE-FTEOS process for forming the second FSG layer 60. The HDP processes use a silane-based oxide, which is different from TEOS. The thickness of the second FSG layer 60 is preferably in a range of from one to two times the thickness of the first FSG layer 20. The second FSG layer 60 preferably has a dielectric constant in a range of from 3.5 to 3.8.

Figure 1B:
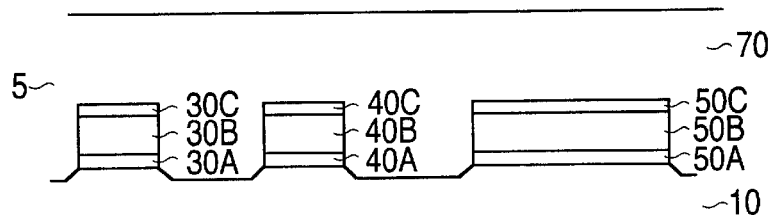

FIG. 1B shows the semiconductor device 5 after a chemical mechanical polishing (CMP) and clean has been performed on the semiconductor device 5. FSG layer 70 includes both the first and second FSG layers 20, 60 of FIG. 1A. By virtue of the CMP and clean step, the top surface of FSG layer 70 is made to have a substantially planar surface. Of course, the top surface of the FSG layer 70 may be planarized by other methods known in the art, such as by an etch back. The CMP and clean step removes about 0.7 to 1.0 microns of the top portion of the FSG layer 70, leaving an FSG layer of from 0.8 to 1.0 microns in thickness. Of course, other thicknesses are possible.

Figure 1C:
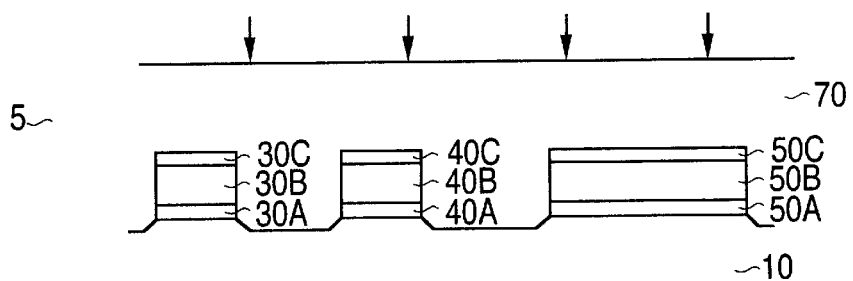

FIG. 1C shows a step of providing a surface treatment to the FSG layer 70, in a manner described in a related co-pending U.S. patent application Ser. No. 09/157,240, filed Sep. 18, 1998, which is incorporated in its entirety herein by reference. This surface treatment step involves treating the surface of the FSG layer 70 with a plasma containing hydrogen (shown by the downward-pointing arrows in FIG. 1C). For example, the plasma may be pure hydrogen, or it may be diluted $H_2$ plasma, such as, for example, an $H_2/N_2$ plasma. The purpose of the hydrogen plasma is to make the hydrogen less volatile. That is, the activation energy of the hydrogen is too high to bond with the fluorine atoms if it is not in a plasma form.

Figure 1D:
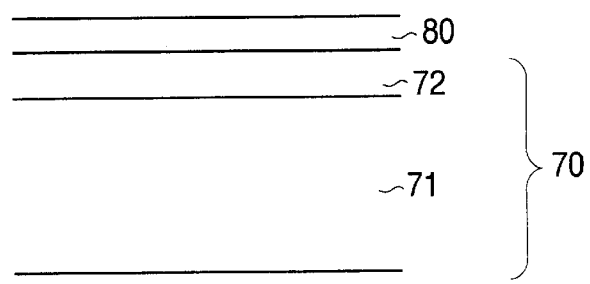

The hydrogen in the plasma will bond with the fluorine atoms in the FSG layer 70 to form HF, which, because of its high vapor pressure and low boiling point, will be vaporized and evacuated from the system, leaving a fluorine depleted region (layer 72 in FIG. 1D).

In the preferred embodiment, the hydrogen treatment is performed in a CVD chamber, such as, for example, an Applied Materials CVD chamber. The CVD chamber may be the same chamber used to deposit a subsequent conducting layer, such as Ti, TiN, Ta, or TaN. Preferably, the CVD chamber for the hydrogen plasma treatment should have a slightly elevated temperature (5–50° C. higher) relative to the temperature used to deposit the subsequent conducting layer. For example, if a temperature falling in the range of 375° C. to 450° C. is to be used to deposit a subsequent conducting layer, then a slightly elevated temperature that is 5–50° C. higher than a conducting layer CVD deposition temperature (performed after the hydrogen plasma treatment) is used during the hydrogen plasma treatment step. The purpose of the use of this elevated temperature is to lower the probability that heating during the subsequent conducting layer deposition step will drive the fluorine atoms from the bulk FSG layer 71 into the fluorine-depleted region 72, which are layers that exist after the surface treatment of the FSG layer 70 with hydrogen plasma, as shown in Figure 1D.

The other parameters for the hydrogen plasma treatment step will be determined empirically. Typically, the pressure in the CVD chamber will be in the milli-torr to torr range, the energy parameter will be in the several hundred watt range, and plasma treatment time will range from 20 seconds to several minutes. Optimized parameters will be determined based on the desired thickness of the fluorine-depleted region.

FIG. 1D also shows a nitrided region 80, which is about 50 angstroms in thickness. The nitrided region 80 acts as a passivation layer, and may be an SiON layer, for example. In the present invention, a portion of the depleted region 72 is passivated to form the passivation layer 80, which is less than the thickness of the depleted region 72. One purpose of the passivation layer 80 is to bond non-volatile atoms into the depleted region 72 to lessen the probability of fluorine atoms from the bulk FSG layer 71 diffusing up into the depleted region 72 and thereafter reacting with the conducting layer atoms of a subsequently deposited layer.

The passivation step may be carried out by switching to a pure $N_2$ plasma in a CVD chamber to form SiON to a thickness that is less than the thickness of the depletion region 72, thereby leaving a passivation layer 80 and fluorine depleted region 72 as shown in FIG. 1D. Typically, a higher source power will be used in the CVD chamber, for example, 300–400 watts, to cause the nitrogen to bond with the SiO surface to yield an SiON dielectric barrier. This passivated dielectric barrier layer 80 lessens the potential that fluorine atoms will diffuse up to the surface of the fluorine-depleted region 72, and thereafter react, for example, with a Ti or TiN barrier metal deposited thereabove.

A lower bias power (the bias power is different than the plasma power) and a higher pressure condition preferably is used to treat sidewalls and vias in the FSG layer 70, which are provided for electrical connections to layers below the FSG layer 70. For example, a bias power of less than 100 watts may be utilized. One purpose for the low bias power is to make the plasma less directional so that it will better affect the sidewalls. In the present invention, the fluorine-depleted region 72 is about 100 angstroms in thickness, and the nitrided region that forms the passivation layer 80 is about 50 angstroms in thickness. Of course, other sizes may be contemplated while remaining within the scope of the invention as described herein. The exact thickness of the passivation layer 80 may be optimized empirically. A SIMS analysis may be performed to measure the thickness of the fluorine-depleted region 72 and the thickness of the passivation layer 80. Ultimately, optimization is achieved when the depletion and passivation layer thicknesses are such that it can be assumed that any subsequent layer applied thereto will not peel off during the remaining process steps for creating the semiconductor device on the substrate.

Figure 1E:
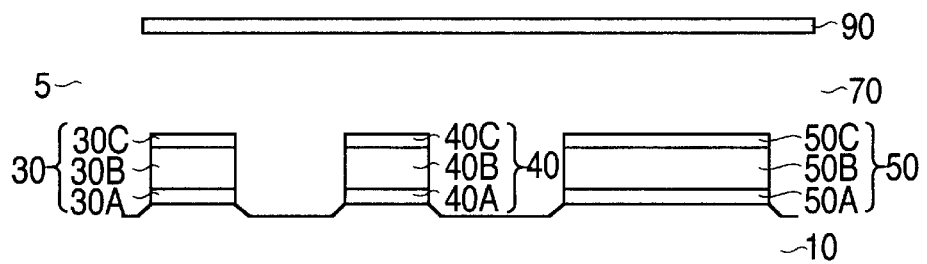

After the passivation step, an oxide cap 90 is deposited onto the silicon substrate, as shown in FIG. 1E. The oxide cap 90 preferably has a thickness of from 500–2500 angstroms, with the thickness being based on the quality of the oxide cap (e.g., better quality oxide cap means lesser thickness needed). The $SiO_2$ cap is preferably deposited by way of PECVD. The oxide cap 90 can be either $SiH_4$ or TEOS based, and preferably is an silicon-rich oxide with a reflective index (RI) greater than 1.47. This may be achieved by increasing the silane flow and power during the PECVD process, for example. A silicon-rich oxide cap makes the oxide cap denser and more solid than a conventional oxide cap (e.g., one with an RI=1.45), thereby providing an additional barrier for fluorine atoms that may (due to thermocycles) move from the FSG layer and through the oxide cap to a metal layer disposed thereabove.

Preferably, the surface treatment step and the oxide cap step are performed in-situ to simplify production and to maximize throughput. One or more conducting layers (not shown) may be provided on top of the oxide cap 90. These conducting layers are electrically connected to one or all of the metal stacks 30, 40, 50, or to regions in the substrate by virtue of conductive material, such as tungsten, provided in vias formed in the FSG layer 70. The fluorine-depleted region 72 at the top portion of the FSG layer 70 lessens the possibility that any fluorine atoms will diffuse up to the conducting layers, and thereby lessening the possibility of forming impurities in those layers. The nitride layer 80 and oxide cap 90 act a barrier to keep the fluorine atoms in the FSG layer 70 from corrupting the conducting layers.

Figure 1F:
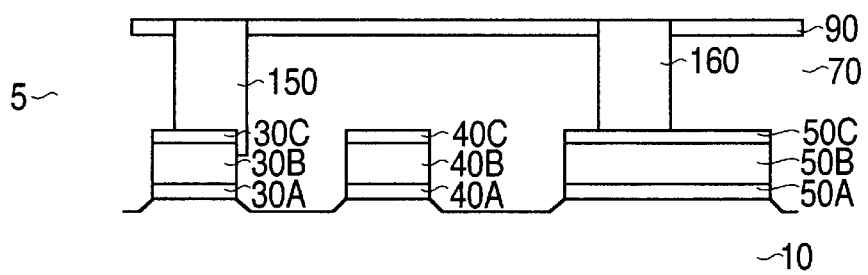
Figure 1G:
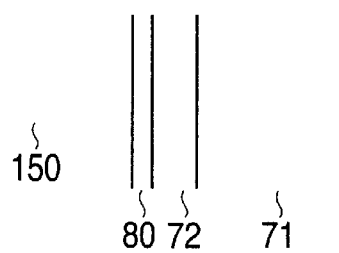

FIG. 1F shows the semiconductor device after vias 150, 160 have been formed in the FSG layer 70 and the oxide cap 90. Via 150 provides an electrical connection to metal stack 30 by virtue of an electrical conductor (e.g., tungsten) provided in the via 150, and via 160 provides an electrical connection to metal stack 50 by virtue of an electrical conductor provided in the via 160. Vias 150, 160 may be formed by using a contour mask and an etch using a plasma treatment, in a manner known to those skilled in the art. Via 150 is shown as being formed offset with respect to the metal stack 10. This may be an unintentional effect due to, for example, offset in a stepper used in chip manufacturing process. The offset via 150 shown in FIG. 1F does not cause a problem in circuit operation as long as the bottom surface of the via 150 contacts at least a portion of the top layer (e.g., ARC layer 30C) of the metal stack 30. On the other hand, vias may be intentionally formed offset with respect to conducting layers directly above and below the vias, in order to better take advantage of the real estate on a semiconductor chip.

After the plasma treatment, a barrier metal (Ti or TiN, for example) is deposited in the vias 150, 160, to thereby form a thin barrier layer in the vias. The sidewall treatment of the vias is discussed above, and is shown in detail in FIG. 1G with respect to via 150. The side surface of via 150 (and also via 160) has a nitrided region 80, a fluorine-depleted region 72, and a bulk FSG region 71.

Figure 1H:
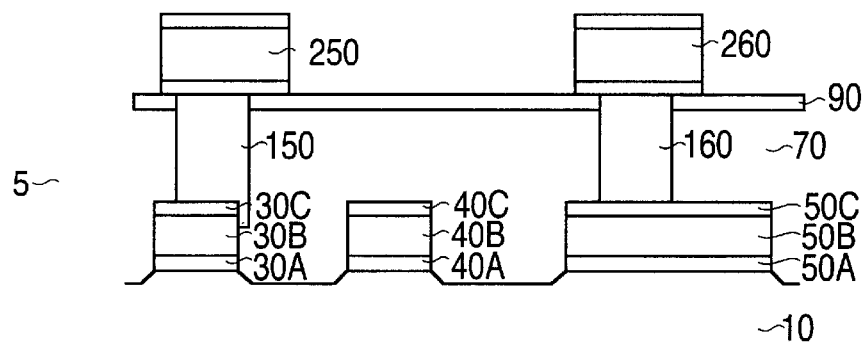

FIG. 1H shows a conducting layer 250 and a conducting layer 260 that have been formed above the oxide cap 90. By way of example, an in-situ deposition of optimized CVD-TiN may be accomplished in the previously-mentioned CVD chamber using a nitrogen-rich initial layer. This deposition would then be followed by a standard blanket tungsten deposition to provide a conducting material in the vias. A tungsten CMP and clean step is then performed after the tungsten has been deposited in the vias. A conducting layer, such as metal-2 layer (where the metal stacks 10, 20, 30 correspond to a metal-1 layer), is then deposited above the oxide cap 90 and vias. Then, a mask is utilized with an etch (plasma treatment) to form the conducting layers 250 and 260 in the desired locations on the semiconductor device 5. Conducting layer 250 is electrically connected to metal stack 10 by virtue of the tungsten (of other conductive material) in the via 150, and conducting layer 260 is electrically connected to metal stack 30 by virtue of the tungsten (or other conductive material) in the via 160. FSG layer 70 provides for electrical separation between components above and below that layer, and allows for electrical connections to those layers by way of vias formed in the FSG layer 70. For example, FSG layer 70 may be formed between a metal-2 layer and a metal-3 layer, or between a metal-3 layer and a metal-4 layer, etc.

Figure 2:
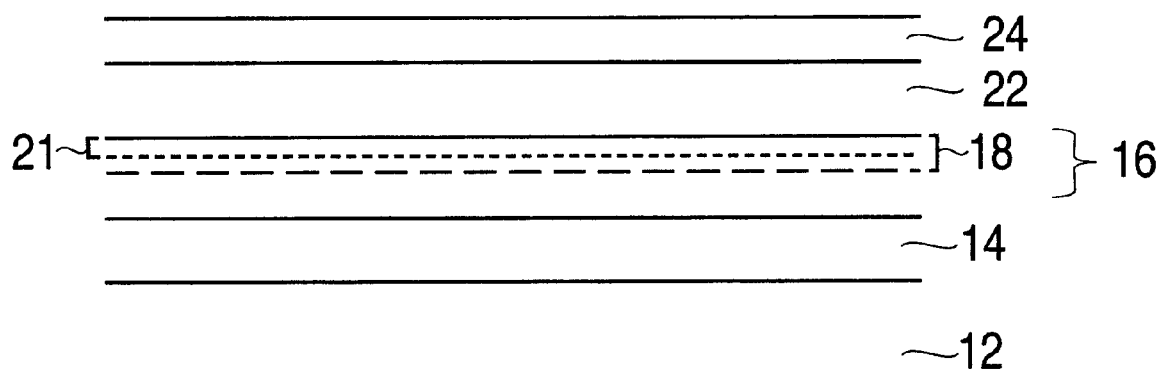
FIG. 2 shows a structure having a fluorine-depleted region that is formed between two conducting layers.
Figure 3:
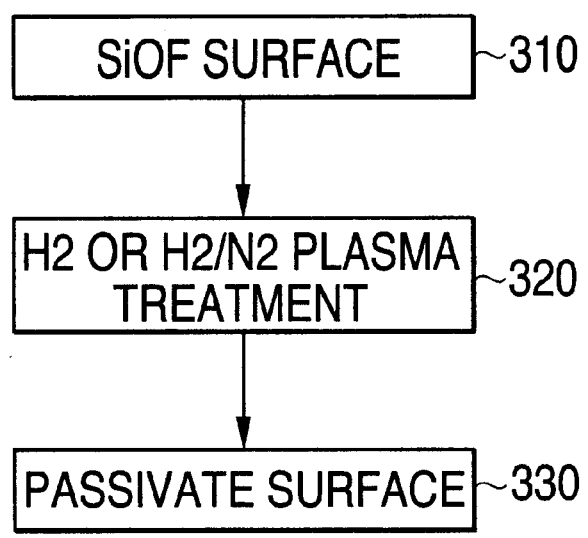
FIG. 3 shows the steps involved in creating a fluorine-depleted region on a fluorine-based inter-layer dielectric according to the invention.

FIG. 2 shows a structure having a bulk substrate 12, a first conducting layer 14 formed on the substrate 12, a SiOF layer 16 that is formed on the first conducting layer 14 and that includes a depleted layer 18 and an SiON passivation layer 21, a second conducting layer 22 formed on the passivation layer 21, and a tungsten-deposition layer 24 formed on the conducting layer 22. FIG. 2 is taken from the related U.S. patent application Ser. No. 09/157,240, discussed above. FIG. 3 is also taken from the related U.S. patent application Ser. No. 09/157,240, and shows the three steps involved in creating a fluorine-depleted region. In a first step 310, an SiOF layer or other type of fluorine-based layer is deposited. Then, in a step 320, either $H_2$ or $H_2/N_2$ plasma treatment is performed, to thereby create a fluorine-depleted region 18 in the SiOF layer. Next, in a step 330, the surface of the fluorine-depleted region 18 is passivated with a nitrogen-rich plasma to form a passivation layer 20. The passivation layer 20 provides additional protection in keeping fluorine atoms in the SiOF layer from moving into a conducting layer formed above the SiOF layer.

While the present invention is particularly advantageous when used to form an SiOF (or FSG) inter-metal dielectric layer, it has application in any situation where the fluorine atoms in an inter-metal dielectric are causing interaction and/or adhesion problems with other neighboring layers.

While a preferred embodiment has been described herein, modification of the described embodiment may become apparent to those of ordinary skill in the art, following the teachings of the invention, without departing from the spirit and scope of the invention as set forth in the appended claims.

Moreover, in relation to the claims, a substrate may generally be defined as any layer or material which lies underneath and supports the inter-layer dielectric.

The present invention has been described with respect to a metal stack that corresponds to a metal-1 layer. Of course, the present invention is applicable to the protection of any kind of conducting layer besides a metal stack.

Also, the present invention ha been described with respect to a two-step formation of an FSG layer. One of ordinary skill in the art will recognize that the formation of a fluorine-depleted region, a nitrided region, and an oxide cap according to the present invention may be done no matter how the FSG layer was formed on a substrate (e.g., one-step process for forming an FSG layer).

What is claimed is:

1. A method of forming an interlayer dielectric on a substrate, comprising:

forming a first conducting layer on the substrate;

forming a first interlayer dielectric layer on the first conducting layer by an in-situ high density plasma process using a high etch/deposition ratio with high bias power, the first interlayer dielectric layer containing fluorine;

forming a second interlayer dielectric layer on the first interlayer dielectric layer by an in-situ high density plasma process using a low etch/deposition ratio, the second interlayer dielectric layer containing fluorine;

forming a second conducting layer above the second interlayer dielectric layer; and forming at least one via in the first and second interlayer dielectric layers to provide a path for an electrical connection between the first and second conducting layers, wherein the step of forming the at least one via includes the substeps of:

forming a fluorine-depleted region that extends along the sidewalls of the at least one via, the forming of the fluorine-depleted region being performed by providing, in a CVD chamber, a hydrogen-containing plasma in a direction of the at least one via;

forming a nitrided region adjacent to the fluorine-depleted region that had been previously formed on the sidewalls of the at least one via, the forming of the nitrided region being performed by providing, in the CVD chamber, an N2 plasma in a direction of the at least one via, wherein the fluorine-depleted region is sandwiched between the nitrided region on one side and the first and second interlayer dielectric layers on another side, wherein the fluorine-depleted region contains less fluorine concentration than the first and second interlayer dielectric layers, wherein the nitrided region acts as a passivation layer that blocks fluorine atoms from the fluorine-depleted region and from the first and second interlayer dielectric layers from passing into the at least one via, and wherein the first and second interlayer dielectric layers collectively form the interlayer dielectric.

2. The method according to claim 1, wherein the conducting layer comprises at least one metal stack disposed on the substrate.

3. The method according to claim 2, wherein the first interlayer dielectric layer has a thickness of about 1.2 times a height of the at least one metal stack.

4. The method according to claim 3, wherein the second interlayer dielectric layer has a thickness of from one to two times the thickness of the first interlayer dielectric layer.

5. The method according to claim 1, wherein the first interlayer dielectric layers is formed using an etch/deposition ratio of between 0.6 and 0.8.

6. The method according to claim 1, wherein the first and second interlayer dielectric layers are fluorosilicate glass FSG.

7. The method according to claim 5, wherein the first interlayer dielectric layer is formed using a high bias power.

8. The method according to claim 1, wherein the first and second interlayer dielectric layers are formed in-situ.

9. The method according to claim 1, wherein the first and second dielectric layers each have a dielectric constant in a range of from 3.5 to 3.7.

10. The method according to claim 1, further comprising the step of planarizing a top surface of the second interlayer dielectric layer.

11. The method according to claim 10, wherein the planarizing step is performed by one of a chemical mechanical polishing and an etch back process.

12. The method according to claim 10, further comprising the step of treating the planarized top surface of the second interlayer dielectric layer with an H2/N2 plasma.

13. The method according to claim 12, wherein, after the treating step, a fluorine-depleted region is formed along a top portion of the second interlayer dielectric layer.

14. The method according to claim 12, further comprising the step of providing a passivation layer on the treated second interlayer dielectric layer.

15. The method according to claim 14, wherein the passivation layer is a nitrided region having a thickness less than a thickness of the fluorine-depleted region.

16. The method according to claim 14, further comprising the step of providing an oxide cap on the passivation layer.

17. The method according to claim 16, wherein the oxide cap is a $SiO_2$ layer having a thickness of from 500 to 2500 angstroms.

18. The method according to claim 17, wherein the treating step and the oxide cap providing step are performed in-situ.

19. The method according to claim 1, wherein the hydrogen-containing plasma is an H2/N2 plasma.

20. The method according to claim 1, wherein the first and second conducting layers are formed in the CVD chamber, and wherein the step of forming the nitrided region is formed at a temperature of between 5 to 50 degrees higher than the step of forming the first and second conducting layers.

21. The method according to claim 1, wherein the step of forming the nitrided region is formed at a higher source power in the CVD chamber than what is used in the step of forming the fluorine-depleted region.

22. The method according to claim 21, wherein the higher source power used in the step of forming the nitrided region is between 300 to 400 watts, and wherein the higher source power causes nitrogen to bond with silicon oxide and thereby form an SiON dielectric barrier which corresponds to the nitrided region.

* * * * *